(12) United States Patent
Weichart

(10) Patent No.: US 7,736,462 B2
(45) Date of Patent: Jun. 15, 2010

(54) INSTALLATION FOR PROCESSING A SUBSTRATE

(75) Inventor: Jurgen Weichart, Balzers (LI)

(73) Assignee: OC Oerlikon Balzers AG, Balzers (LI)

( * ) Notice: Subject to any disclaimer, the term of this patent is extended or adjusted under 35 U.S.C. 154(b) by 19 days.

(21) Appl. No.: 10/542,075

(22) PCT Filed: Jan. 13, 2004

(86) PCT No.: PCT/CH2004/000010

§ 371 (c)(1),
(2), (4) Date: Jan. 23, 2006

(87) PCT Pub. No.: WO2004/064122

PCT Pub. Date: Jul. 29, 2004

(65) Prior Publication Data

US 2006/0108231 A1    May 25, 2006

Related U.S. Application Data

(60) Provisional application No. 60/439,745, filed on Jan. 13, 2003.

(51) Int. Cl.
*H01L 21/00* (2006.01)
*C23C 16/00* (2006.01)
*C23C 14/00* (2006.01)

(52) U.S. Cl. .......... 156/345.51; 118/728; 118/725; 118/724; 156/345.52; 361/234; 279/128

(58) Field of Classification Search .......... 118/728, 118/729, 500, 503, 721; 156/345.51; 414/935–41
See application file for complete search history.

(56) References Cited

U.S. PATENT DOCUMENTS 4,680,061 A    7/1987  Lamont
4,743,570 A    5/1988  Lamont (Continued)

FOREIGN PATENT DOCUMENTS

EP    0 486 966    5/1992

(Continued)

*Primary Examiner*—Ram N. Kackar
(74) *Attorney, Agent, or Firm*—Pearne & Gordon LLP

(57) ABSTRACT

The invention relates to an installation, in particular a vacuum processing installation for processing a substrate (130), in particular a semiconductor wafer, comprising a processing station. Said installation comprises a frame (110), to which is clamped a carrier (120), for holding and/or transporting the substrate (130), whereby the latter (130) can be fastened by its entire surface to said carrier (120). The processing station preferably comprises a chuck electrode (140) with a flat outer surface (141) and the carrier (120) can be positioned parallel and adjacent to said outer surface (141) of the chuck electrode (140). The carrier is composed in particular of a non-conductive dielectric material and is provided on one side with a conductive layer (122), in such a way that the chuck electrode (140) and the carrier (120) form an electrostatic chuck.

32 Claims, 3 Drawing Sheets

U.S. PATENT DOCUMENTS

| | | | |
|---|---|---|---|
| 5,258,047 A * | 11/1993 | Tokisue et al. | 29/25.01 |
| 5,460,684 A | 10/1995 | Saeki et al. | |
| 5,508,357 A * | 4/1996 | Matsuura et al. | 525/420 |
| 5,539,179 A * | 7/1996 | Nozawa et al. | 219/121.43 |
| 5,708,557 A | 1/1998 | Feigenbaum et al. | |
| 5,737,178 A * | 4/1998 | Herchen | 361/234 |
| 5,880,924 A | 3/1999 | Kumar et al. | |
| 5,886,863 A * | 3/1999 | Nagasaki et al. | 361/234 |
| 6,238,160 B1 | 5/2001 | Hwang et al. | |
| 6,259,592 B1 | 7/2001 | Ono | |
| 6,473,288 B2 * | 10/2002 | Shima et al. | 361/234 |
| 6,477,787 B2 | 11/2002 | Morad et al. | |
| 6,491,083 B2 * | 12/2002 | De et al. | 156/584 |
| 6,497,784 B1 * | 12/2002 | Jones et al. | 156/345.12 |
| 6,547,559 B1 * | 4/2003 | Hodos | 432/253 |
| 6,642,127 B2 * | 11/2003 | Kumar et al. | 438/460 |
| 6,692,221 B2 * | 2/2004 | Toya | 414/222.01 |
| 2002/0078891 A1 * | 6/2002 | Chu et al. | 118/715 |
| 2003/0012628 A1 * | 1/2003 | Nigg et al. | 414/222.01 |
| 2003/0037882 A1 * | 2/2003 | Arita et al. | 156/345.51 |
| 2003/0178638 A1 * | 9/2003 | Fujii | 257/192 |

FOREIGN PATENT DOCUMENTS

| | | |
|---|---|---|
| EP | 0 844 659 A | 5/1998 |
| JP | 03003250 A * | 1/1991 |
| JP | 10-303286 | 11/1998 |
| JP | 2000-288857 | 10/2000 |

* cited by examiner

INSTALLATION FOR PROCESSING A SUBSTRATE

FIELD OF THE INVENTION

The invention relates to an installation, in particular a vacuum process installation, for processing a substrate, in particular a semiconductor wafer, having at least one processing station. The invention also relates to a processing station for an installation of this type, to a frame for an installation of this type, for holding and/or transporting the substrate, to a film which is to be clamped into the frame and to a method for processing a substrate, in particular a semiconductor wafer, in a vacuum process installation.

PRIOR ART

Semiconductor wafers for the production of integrated circuits are usually processed in vacuum process installations which comprise one or more processing stations, in which the wafer is etched or coated in a vacuum chamber, e.g. by means of a CVD (chemical vapor deposition) or PVD (physical vapor deposition) process. In this context, it is important for the wafer to be held in a mechanically stable position in the chamber during processing, and for its temperature to be monitored, so that in particular process heats applied to the wafer can be dissipated. Otherwise, there is a risk of the wafer being excessively heated, which can lead to damage or destruction of the wafer.

To increase productivity, increasingly large wafers are being used, in some cases with a diameter of 300 mm; in future, it is likely that even larger diameters will be used. The large surface area and low thickness of these substrates (typically 0.8 mm or less) impose additional mechanical demands both on the holding of the wafers while they are being processed and on the transporting of the wafers through the vacuum process installation, since even low levels of forces can lead to damage or destruction of the substrates. To improve the monitoring of the temperature, the wafers are partially ground down on the back surface until their thickness is 200 µm or less, and in some cases even just 50-75 µm. Then, the ground wafers are metallized on their back surface in a vacuum process installation. With such thin substrates, the demands imposed on holding and transport are even higher.

At the same time, good dissipation of the process heat which occurs, for example, in sputtering processes has to be ensured, since otherwise the thin substrates, with their low heat capacity, will very quickly reach temperatures of more than 150° C., at which existing layer systems on the wafers can already be damaged. Moreover, even when heated to temperatures lower than this, there is a risk of internal thermal stresses occurring in a layer which has been deposited on the substrate, and during cooling these stresses lead to deformation of this layer. Dissipation of the process heat is difficult in vacuum chambers since the heat transfer has to be effected primarily through thermal radiation.

U.S. Pat. Nos. 4,680,061 and 4,743,570 (Varian) show a method for controlling the temperature of wafers in a vacuum chamber. The wafers are held in openings in a carrier disk over their circumference by means of a plurality of clips. To be cooled, they are moved into a position adjacent to a planar surface of a cooling element, with argon being introduced into a narrow gap between the cooling element and the back surface of the wafer, so as to boost the transfer of heat from the wafer to the cooling element through heat conduction in this back-surface gas.

U.S. Pat. No. 6,477,787 B2 (Applied Materials) relates to a method for heating and cooling substrates in the same chamber, so that there is no need for a separate cooling chamber. The cooling mechanism comprises a cooling plate, onto which the substrate can be transported by a transport mechanism, e.g. a transport ring with inwardly directed carrying fingers or a plurality of lifting pins. The cooling can be improved by a flow of gas between the cooling plate and the substrate.

However, the mechanical transport and holding apparatuses disclosed in these documents are relatively unsuitable for large-area substrates with a low thickness, since the holding forces are unevenly distributed over the wafer, resulting in mechanical stresses. The maximum pressure of the back-surface gas, and therefore the maximum transfer of heat, are limited, since beyond a certain gas pressure the wafer, which is held on the circumferential side or in punctiform fashion, starts to be deformed. This means that it is impossible to achieve effective cooling for thin substrates.

U.S. Pat. No. 5,880,924 (Applied Materials) describes an electrostatic chuck which allows a substrate to be securely held in place and released quickly by shortening the chuck loading and unloading times. For this purpose, the chuck comprises a dielectric layer, onto which the substrate is placed, a charging electrode, which is embedded in the dielectric layer, and a discharging electrode, which is arranged so as to be insulated from the charging electrode and contact-connects the substrate at the surface of the dielectric layer.

U.S. Pat. No. 6,238,160 B1 (Taiwan Semiconductor Manufacturing) describes a method for transporting and electrostatically chucking a semiconductor wafer in a processing chamber, in which an electrostatic gripper arm is used. The gripper arm charges the wafer and holds it during its transportation by electrostatic forces. This has the advantage that the wafer is at the same time partially pre-charged, thereby simplifying chucking on the electrostatic chuck and making it possible to avoid a gas plasma within the chamber or a charging electrode for contact-connection of the wafer. When the wafer has been chucked on the chuck, its temperature can be controlled, with the assistance of a back-surface gas, e.g. helium, which is introduced into the space between the wafer and the chuck.

The electrostatic chuck improves the holding of the substrate. In particular, it is also possible to use a higher pressure for the back-surface gas without the substrate being deformed, which allows the dissipation of process heat to be improved.

However, the chuck is complex to produce and requires frequent maintenance; in particular, the component which contact-connects the substrate has to be replaced at regular intervals. The operation of releasing the mechanically sensitive substrate from the surface of the chuck is also critical. This is generally done using spaced-apart pins, and if the chuck is insufficiently discharged can lead to damage or destruction of the substrate.

SUMMARY OF THE INVENTION

It is an object of the invention to provide an installation which belongs to the technical field mentioned above, has a simple structure, is easy to maintain and in which a thin and/or large-area, mechanically sensitive substrate can be processed without the risk of damage or destruction.

The object is achieved by the features of claim 1. According to the invention, to hold and/or transport the substrate, the installation comprises at least one frame with a clamped-in carrier, it being possible for the substrate to be secured to the carrier over a large area.

The large-area securing means that the substrate is held securely on the carrier and is thereby mechanically stabilized, unlike when using a holding arrangement in which the substrate is held only at its edge or at spaced-apart points. Moreover, the substrate can remain on the carrier during processing, which means that there is no need for complex clamping or release operations, which are likely to cause damage, and the structure of the installation is simplified. Therefore, it is preferable for the substrate to be secured to the carrier prior to processing, and for it to remain there during the transport and processing operations and only to be released from the carrier again after processing has taken place, outside the installation. The frame with the carrier is generally transported out of the installation and is therefore easy to inspect and maintain or replace if necessary.

The invention is not restricted to the processing of semiconductor wafers, but rather can also be used for a wide range of in particular large-area and/or thin workpieces, e.g. based on glass or plastic. It is therefore suitable in particular for the processing of electronic components, including after they have been divided from one another, or solar cells.

The substrate is preferably adhesively bonded onto a first planar main surface of the carrier by means of a vacuum-compatible and releasable adhesive. This ensures large-area securing to the carrier. It is preferable for the adhesive to have a good thermal conductivity, resulting in optimum dissipation of heat.

It is advantageous for the at least one processing station to comprise an electrostatic chuck device, or electrostatic chuck for short, i.e. a chuck electrode having a planar outer surface, it being possible for the carrier to be positioned parallel and adjacent to the outer surface of the electrode. The combination of the large-area securing on the carrier and the large-area holding on the chuck allows extraordinarily stable mechanical supporting of the substrate and accordingly also good dissipation of heat. It is preferable for the extent of the planar outer surface to correspond at least to a main surface of the substrate. In certain cases, however, the useful area of the substrate may be smaller than the total surface area of the substrate main surface, e.g. if a single, quadrilateral semiconductor component is being produced on a round wafer. In this case, the planar outer surface can be selected in such a way that not all of the substrate, but rather only the useful surface area, which has been reduced for technical reasons, can be held on the chuck.

The stable securing of the substrate to a carrier clamped in a frame is also advantageous for processing stations in which cooling is not required.

It is preferable for the carrier to consist of a nonconductive dielectric material and to be provided with a conductive layer on one side. The frame is conductive at least regionally, and the carrier is clamped in the frame in such a way that the conductive layer is contact-connected to the conductive region of the frame. The conductive layer of the carrier, together with the dielectric material and the chuck electrode, forms the electrostatic chuck device, the conductive layer and the chuck electrode, as it were, forming two plates of a plate-type capacitor. If the carrier is arranged in such a way that the conductive layer faces away from the chuck electrode, i.e. that the conductive layer contact-connects the substrate, the dielectric material of the carrier increases the attraction force in the parallel-plate field.

An electrostatic chuck which is formed in this way by the electrode and the carrier clamped in the frame has a simple structure. The fact that part of the electrostatic chuck device is generally transported out of the installation together with the carrier simplifies maintenance work on the chuck device, since this extremely maintenance-intensive part can be routinely inspected and replaced if necessary. The part which remains in the installation, namely the chuck electrode, is protected during the processing of the substrate by the carrier arranged in front of it, and consequently the level of maintenance required for this part is low.

The conductive region of the frame and the contact-connection of the conductive layer of the carrier by this region allows simple connection of the second plate of the chuck device by simply having to contact-connect a contact location on the frame.

Alternatively, the carrier material selected may be a weakly doped dielectric material which has semiconducting properties. This results in the abovementioned Coulomb attraction being replaced by what is known as a Johnsen Rahbek attraction, which can be significantly stronger on account of a shorter effective plate spacing. However, the semiconducting action of the doped dielectric material often only occurs at elevated temperatures, and a continuous charging current is required to compensate for the leakage current which occurs, making the structure of the device more complex.

To release the substrate, the conductive layer of the carrier is advantageously short-circuited with the chuck electrode. With the assistance of the carrier film, this allows the substrate to be lifted off safely without any risk of damage, since there are no localized residual forces which can act on the substrate.

It is preferable for the carrier to be formed by a vacuum-compatible, thermally stable film, and for the conductive layer to be formed by a vapor-deposited metallization or a conductive polymer. An example of a suitable material for the film is polyimide. A film of this type is inexpensive; moreover, in some cases wafers are already secured to carrier films during the grinding operation, in order to be mechanically stabilized, and if an appropriate film material is selected, the same carrier can also be used for the subsequent coating, without the wafer having to be secured to a new holding device.

Alternatively, the carrier may also be produced from another nonconductive dielectric material, e.g. a ceramic or glass.

The film is advantageously from 50-200 μm, preferably approximately 100 μm, thick, and the metallization is advantageously from 0.03-0.5 μm, preferably approximately 0.1 μm, thick. This type of film thickness allows a high mechanical stability and durability of the film. At the same time, however, the cross section of the carrier is still sufficiently small for a high attracting force to be possible if the film material is used as dielectric and for it to be possible to keep the material and production costs at a low level. A metallization of the thickness indicated above can be realized at low cost and has good electrical properties for use in the electrostatic chuck according to the invention; in particular, the high conductivity of a conductive layer of this type breaks down any residual charge which may remain after the chuck has been switched off within a short time.

The thickness of the film or metallization can, of course, be adapted to the particular application, i.e. in particular the dimensions of the substrate, the mechanical conditions or the expected effects of processing. Different carriers can be used in the same installation without problems, for example including carriers made from a film material for certain substrates and different carriers, for example made from glass, for other substrates.

If radiofrequency is to be used during the processing of the substrate, e.g. during etching, the chuck electrode can be constructed on a base body which comprises a radiofrequency electrode, the chuck electrode being electrically insulated from the radiofrequency electrode. The chuck electrode is preferably contact-connected by an insulated leadthrough passing through the radiofrequency electrode. In this case, it is advantageous for the electrostatic chuck to be floating, i.e. not to be connected to the radiofrequency source or to ground potential. This also allows a radiofrequency voltage to be used in a simple way to process the substrate which has been secured to the carrier and is held by the chuck.

If the carrier is arranged in front of the chuck electrode in such a way that the conductive layer faces the chuck electrode, a dielectric is arranged in front of the chuck electrode, in such a way that it is located between the chuck electrode and the carrier. By selecting a thin dielectric with a high dielectric constant $\in_r$, it is possible to achieve a high attracting force irrespective of the material of the carrier. A particularly suitable dielectric is a plate of aluminum oxide $Al_2O_3$ with the high dielectric constant $\in_r \approx 10$.

Alternatively, as has already been mentioned, it is possible for the carrier to be arranged in front of the chuck electrode in such a way that the carrier material forms the dielectric between the chuck electrode and the conductive layer. This allows a simpler and less expensive structure of the installation, but on account of the typically lower dielectric constants of economically viable carrier materials, leads to lower attraction forces. However, the forces which can be achieved in this way are sufficient for many applications.

It is advantageous for the processing station to comprise a voltage source for applying a voltage between the frame and the chuck electrode, it being possible in particular to generate a DC voltage of 200-1500 V, preferably 500-1000 V. On account of the conductive connection between the frame and the conductive layer of the carrier, it is thus possible, in a simple way, to form an electrostatic chuck device, without either direct contact-connection of the substrate or a gas plasma for charging and discharging being required. The voltages indicated, for standard carrier cross sections, lead to a contact pressure which is suitable for the processing of semiconductor wafers.

The chuck electrode may comprise a plurality of regions of different polarity. This makes it possible to form a bipolar or multipolar electrostatic chuck device which does not require a counterelectrode or counterplate. In this case, therefore, there is fundamentally no need for the conductive layer of the carrier and the corresponding electrical contact-connection. In general, however, the attraction forces which can be achieved with bipolar or multipolar chuck devices are lower than with a unipolar structure.

It is preferable for the processing station to comprise a gas feed for feeding a gas into a space between the chuck electrode and the carrier, it preferably being possible to generate a gas pressure of more than 100 Pa. This allows effective dissipation of heat through heat conduction in the back-surface gas. There is an upper limit on the gas pressure which can be achieved with substrates clamped at their edge in the conventional way, since if this upper limit is exceeded, the back-surface gas pressure leads to excessive bending of the substrate, which is only clamped at the circumference. In the case of large and thin semiconductor wafers, by way of example, it is possible to reach a gas pressure of approx. 20 Pa, which is insufficient for effective cooling. The solution with an electrostatic chuck and large-area securing of the substrate to a carrier allows a significantly higher pressure of the back-surface gas and therefore significantly improved dissipation of heat from the substrate.

During certain processing steps, a chucked substrate can also be heated, for example by suitable control of the temperature of the planar outer surface of the chuck electrode. The heating can also be accelerated by a back-surface gas. Finally, there are processing steps in which there is no need to control the temperature of the substrate. In these cases, however, the chuck device according to the invention ensures that the substrate is held stably and can easily be lifted off the chuck device again after processing has taken place.

The installation according to the invention may comprise a plurality of processing stations and means, e.g. vacuum robots, for transporting the frame together with the clamped-in carrier and the substrate from a first processing station to a second processing station. By way of example, an installation of this type may be of star-shaped construction, so that vertically oriented frames are moved along a circular path, the axis of which is parallel to the main surfaces of the frames. A cluster-type structure with horizontally arranged frames is also possible. Depending on the particular objective, the frames together with the substrate are laid down in the processing stations or held during processing. The processing and transport accordingly take place at the same time or individually. On account of the fact that there is no need for a plasma as conductor or return conductor, a chuck device according to the invention can also be used for pure cooling stations, in which no plasma is built up. Cooling stations of this type may be arranged in an installation between two stations in which more extensive processing of the substrate takes place.

The following detailed description and all the patent claims give further advantageous embodiments and combinations of features of the invention.

BRIEF DESCRIPTION OF THE DRAWINGS

In the drawings, which are used to explain the exemplary embodiment.

In principle, in the figures identical parts are denoted by identical reference numerals.

WAYS OF CARRYING OUT THE INVENTION

Figure 1:
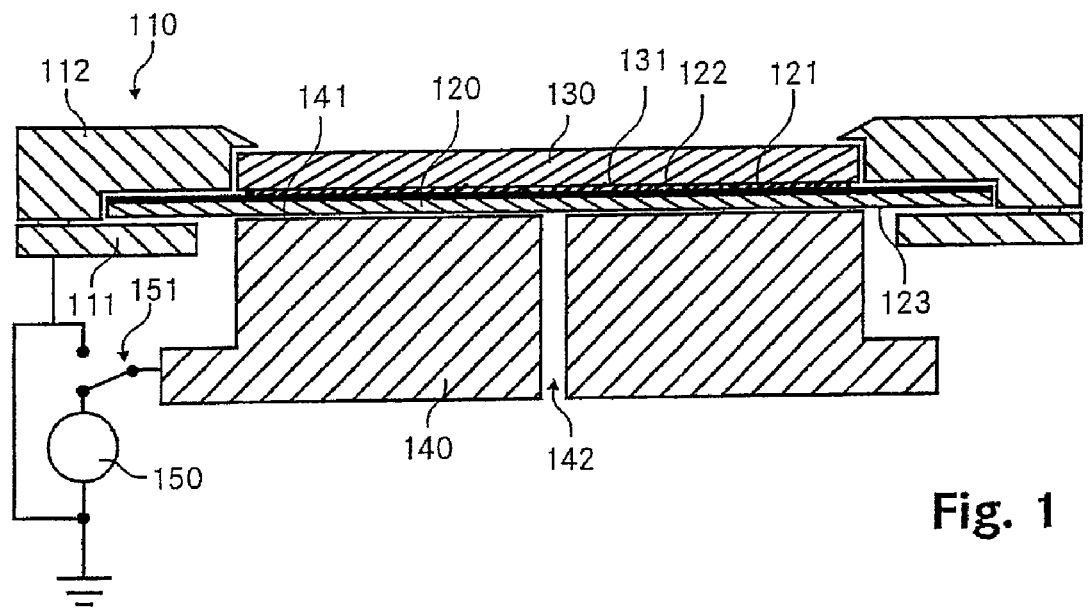
FIG. 1 diagrammatically depicts a unipolar electrode and a holding and transport frame of a first embodiment of a processing station according to the invention.

FIG. 1 diagrammatically depicts a unipolar electrode and a holding and transport frame of a first embodiment of a processing station according to the invention. For the sake of clarity, the length ratios of the components illustrated do not correspond to those used in reality (the same also applies to the following figures). A carrier film 120, to which a large-area and thin substrate 130 has been secured, is clamped in a frame 110. The substrate 130 is, for example, a circular, thinned semiconductor wafer with a diameter of 300 mm and a thickness of 200 μm.

The dimensions of the frame 110 are such that the substrate 130 can be secured over its entire surface to the carrier film 120 clamped in the frame 110. The securing is effected between the underside 131 of the substrate 130 and the upper main surface 121 of the carrier film 120, by means of a vacuum-compatible, advantageously thermally conductive adhesive which is subsequently easy to release again. The frame 110 is composed of an annular bottom part 111 and a corresponding annular top part 112 releasably connected to the bottom part. The carrier film 120 is clamped between the bottom part 111 and the top part 112. The clamping may be effected by a pure compressive clamping action, or in addition or as an alternative, the carrier film 120 may have openings along its periphery, through which corresponding pins of the frame 110 engage.

Both the bottom part 111 and the top part 112 of the frame 110 are made from a conductive metal. The carrier film 120 is made from polyimide and is 100 μm thick. A metallization 122 with a thickness of 0.1 μm, which is electrically contact-connected by the top part 112 of the frame 110, has been vapor-deposited along the upper main surface 121 of the carrier film 120.

The frame 110 with the clamped-in carrier film 120 is arranged adjacent to a planar upper outer surface 141 of a metallic electrode 140, the lower main surface 123 of the carrier film 120 being positioned parallel to and at a short distance from the upper outer surface 141 of the electrode 140. The positioning of the frame 110 in front of the electrode 140 is advantageously effected by a guide (not shown) for the frame 110. The surface area and shape of the upper outer surface 141 of the electrode 140 substantially corresponds to the shape and surface area of the substrate 130 which has been adhesively bonded to the carrier film 120; however, the same electrode 140 also allows substrates of smaller or larger area to be held stably in place.

In the region of its axis of symmetry, the electrode 140 has a gas feed 142, through which a back-surface gas can be fed to the space between the carrier film 120 and the outer surface 141 of the electrode 140. For this purpose, a gas source, which is known per se, is not illustrated and releases the gas, e.g. argon, at a controllable pressure, is connected to the gas feed 142.

A voltage source 150, which generates a DC voltage of, for example, 700 V between the metallization 122 and the outer surface 141 of the electrode 140, is connected between the metallic electrode 140 and the frame 110, which is electrically connected to the conductive metallization 122. The frame 110 and therefore the metallization 122 are at ground potential, while the outer surface 141 is held at a potential of 700 V. This results in an attracting electrostatic force between the metallization 122 of the carrier film 120 and the outer surface 141 of the electrode 140, and the carrier film 120 with the substrate 130 secured to it is pressed onto the electrode 140. The force exerted per unit area F/A corresponds to the known formula $$F/A = \tfrac{1}{2}\varepsilon_0 \varepsilon_r U^2/d^2,$$

in which U denotes the applied voltage and d denotes the thickness of the dielectric. With the arrangement illustrated, with a film thickness d=100 μm, voltage U=700 V and a dielectric constant $\varepsilon_r$=2.5 of the carrier film 120, a contact pressure p=F/A of approx. 540 Pa results. The back-surface gas pressure must not exceed the contact pressure of the electrostatic chuck, to ensure that the carrier film 120 with the substrate 130 is not pressed away from the electrode 140 by the gas pressure. In the example illustrated, therefore, it is possible, for example, to select a back-surface gas pressure of up to approx. 500 Pa, which allows very good heat transfer from the substrate to the chuck. The k value of the back-surface gas at this type of pressure is at least 50 W/m²K. The following situation results for the heat transfer:

| Layer | Si wafer | Adhesive | Film | Back-surface gas |
|---|---|---|---|---|
| Thermal conductivity [W/mK] | 150 | 0.1 | 0.2 | |
| Thickness [μm] | 200 | 20 | 100 | |
| k value [W/m²K] | 7.5 × 10⁵ | 5 × 10³ | 2 × 10³ | 50 |
| % of the thermal resistance | ≈0 | ≈1 | ≈2 | ≈97 |

Under an assumed thermal load of 0.3 W/cm² and a temperature of the electrode surface of 21° C., under stead-state conditions the result is a wafer temperature of just 83° C.

This compares with the situation without a chuck, in which the back-surface gas can only be used at a pressure of 20 Pa, since otherwise the substrate is excessively bent:

| Layer | Si wafer | Adhesive | Film | Back-surface gas |
|---|---|---|---|---|
| Thermal conductivity [W/mK] | 150 | 0.1 | 0.2 | |
| Thickness [μm] | 200 | 20 | 100 | |
| k value [W/m²K] | 7.5 × 10⁵ | 5 × 10³ | 2 × 10³ | 10 |
| % of the thermal resistance | ≈0 | ≈0 | ≈0 | >99 |

On account of the lower gas pressure, the k value of the back-surface gas is at most 10 W/m²K. Under stead-state conditions, at the same thermal loading of 0.3 W/cm² and the same temperature of the cooler surface of 21° C., the result is a wafer temperature of 323° C. This leads to destruction of existing layer structures and to internal thermal stresses in newly formed layers, so that the substrate is damaged or destroyed.

The frame 110 can be short-circuited with the outer surface 141 by a switch 151, so that both components are brought to ground potential. The carrier film 120 together with the substrate 130 can then be released from the electrode 140 without being impeded.

Figure 2:
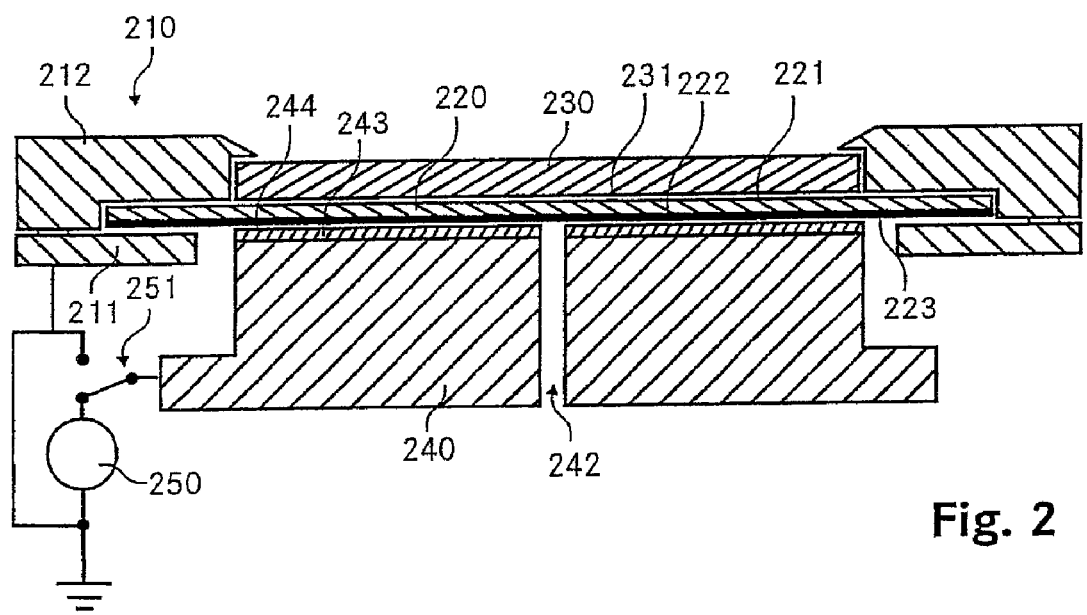
FIG. 2 diagrammatically depicts a unipolar electrode and a holding and transport frame of a second embodiment of a processing station according to the invention, in which a dielectric is arranged between the electrode and the carrier clamped in the frame.

FIG. 2 diagrammatically depicts a unipolar electrode and a holding and transport frame of a second embodiment of a processing station according to the invention, in which a dielectric is arranged between the electrode and the carrier clamped in the frame. Large parts of the second embodiment correspond to the first embodiment illustrated in FIG. 1.

A carrier film 220, to which a large-area and thin substrate 230 has been secured, is clamped in a frame 210. Once again, the underside 231 of the substrate 230 is adhesively bonded to the upper main surface 221 of the carrier film 220. The frame 210 corresponds to the frame 110 of the first embodiment and is composed of an annular bottom part 211 and a corresponding annular top part 212, which is releasably connected to the bottom part, with the carrier film 120 clamped between the two parts of the frame.

A first difference between the second embodiment and the first embodiment consists in the fact that the metallization 222 has been vapor-deposited along the lower main surface 223 of the carrier film 220, i.e. the carrier film 220 is clamped in the reverse orientation in the frame 210. The metallization 222 is contact-connected by the bottom part 211 of the frame, which once again is made from a conductive metal.

The frame 210 with the clamped-in carrier film 220 is arranged adjacent to a dielectric plate 243, which represents the upper termination of a metallic electrode 240. The dielectric plate 243 consists of aluminum oxide $Al_2O_3$, which has a high dielectric constant $\in_r \approx 10$; the thickness is approx. 100 μm. The lower main surface 223 of the carrier film 220 bearing the metallization 222 is positioned parallel to and at a short distance from the upper main surface 244 of the dielectric plate 243.

The surface area and shape of the upper main surface 244 of the dielectric plate 243 and therefore of the electrode 240 once again correspond at least to the shape and surface area of the substrate 230 which has been adhesively bonded to the carrier film 220. Once again, the electrode 240 has a gas feed 242 in the region of its axis of symmetry, through which gas feed a back-surface gas can be fed to the space between the carrier film 220 and the upper main surface 244 of the dielectric plate 243.

A voltage source 250 is connected between the metallic electrode 140 and the frame 210, which is electrically connected to the conductive metallization 222; this voltage source once again generates a DC voltage of, for example, 700 V between the metallization 222 and the electrode 240, with the frame 210 and therefore the metallization 222 once again being at ground potential, while the electrode 240 is held at a potential of 700 V. This results in an attracting electrostatic force between the metallization 222 of the carrier film 220 and the electrode 140, so that the carrier film with the substrate 230 secured to it is pressed onto the electrode 140. Compared to the first embodiment, for the same thickness of the dielectric, the force F/A exerted per unit area in accordance with the abovementioned formula is increased by a factor of approximately 3, on account of the higher dielectric constant $\in_r$ of the dielectric plate 243. Therefore, for the same voltage a contact pressure of approx. 1600 Pa results, so that the back-surface gas pressure can be increased if necessary, in order to further improve the control of the temperature of the substrate.

The frame 210 can once again be short-circuited with the electrode 240 by a switch 251, so that both components are brought to ground potential and the carrier film 220 together with the substrate 230 can be lifted off the electrode 140.

Figure 3:
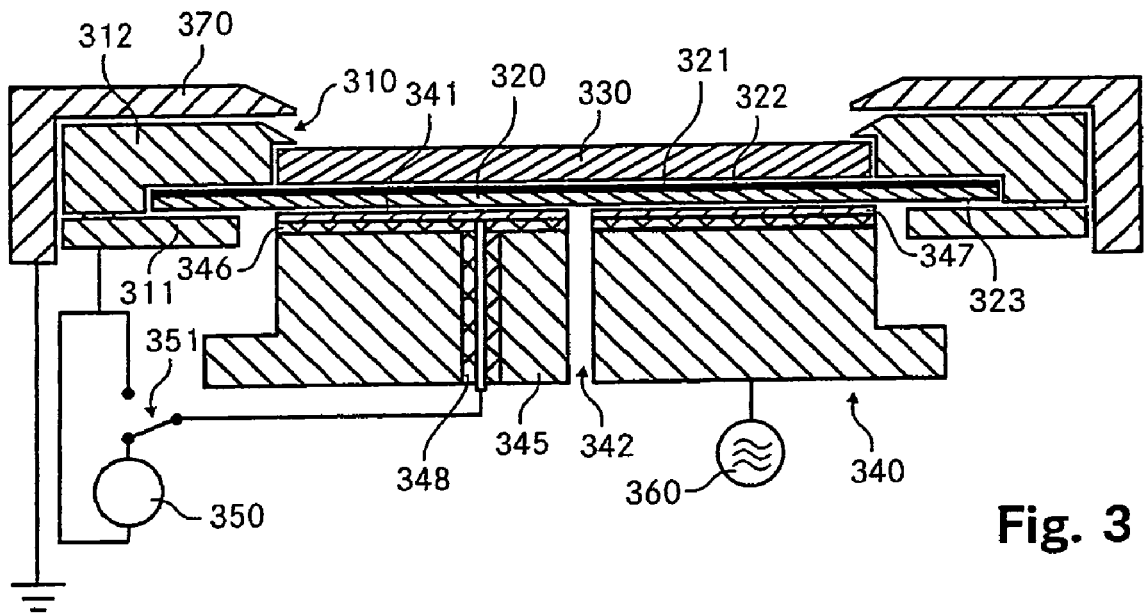
FIG. 3 diagrammatically depicts a unipolar electrode and a holding and transport frame of a third embodiment of a processing station according to the invention, which comprises a radiofrequency source.

FIG. 3 diagrammatically depicts a unipolar electrode and a holding and transport frame of a third embodiment of a processing station according to the invention, which comprises a radiofrequency source. By way of example, a design of this type can be used in a processing station for etching the substrate. The structure and arrangement of the frame 310 are identical to the frame of the first embodiment as illustrated in FIG. 1. A carrier film 320 made from polyimide with a thickness of 100 μm, to which the substrate 330 has been secured over a large area, is clamped in the frame 310. The frame 310 is composed of an annular bottom part 311 and a corresponding annular top part 312 releasably connected to the bottom part, with the carrier film 320 clamped between the two parts of the frame. Both the bottom part 311 and the top part 312 of the frame 310 are made from a conductive metal. A metallization 322 with a thickness of 0.1 μm has once again been vapor-deposited along its upper main surface 321 and is electrically contact-connected by the top part 312 of the frame.

The electrode 340 has a base body, which is formed by a radiofrequency electrode 345 fed by a radiofrequency voltage source 360. On its top side, the radiofrequency electrode 345 is terminated by a ceramic insulator plate 346, the surface area of which corresponds to the cross section of the radiofrequency electrode 345. The chuck electrode 347, once again with the same surface area, is arranged on the insulator plate 346. Once again a gas feed 342 runs through the radiofrequency electrode 345, the insulator plate 346 and the chuck electrode 347. The frame 340 is arranged in such a way that the lower main surface 323 of the carrier film 320 is positioned parallel to and at a short distance from the upper outer surface 341 of the chuck electrode 347.

Once again, a voltage source 350, which generates a DC voltage between the metallization 322 and the upper outer surface 341 of the chuck electrode 347, is connected between the chuck electrode 347 and the frame 310, which is electrically connected to the conductive metallization 322. In this case, however, the metallization 322, unlike in the first embodiment, is not at ground potential, but rather the chuck circuit is floating and is not connected either to the radiofrequency circuit or to ground potential. The contact-connection of the chuck electrode 347 is effected through an insulated leadthrough 348 which passes through the radiofrequency electrode 345 and the insulator plate 346.

An annular shield 370, which is connected to ground potential and the cross section of which approximately corresponds to that of the frame 310, is arranged above the frame 310. This creates a dark space over the frame 310 with respect to the sputtering source used in the etching operation. This prevents material of the frame 310 from being etched away and also prevents material which has been etched from the substrate 330 from being deposited on the frame 310.

Once again, the frame 310 can be short-circuited with the outer surface 341 by a switch 351, so that both components are brought to the same potential. The carrier film 320 together with the substrate 330 can then be released from the chuck electrode 347 without being impeded.

Figure 4:
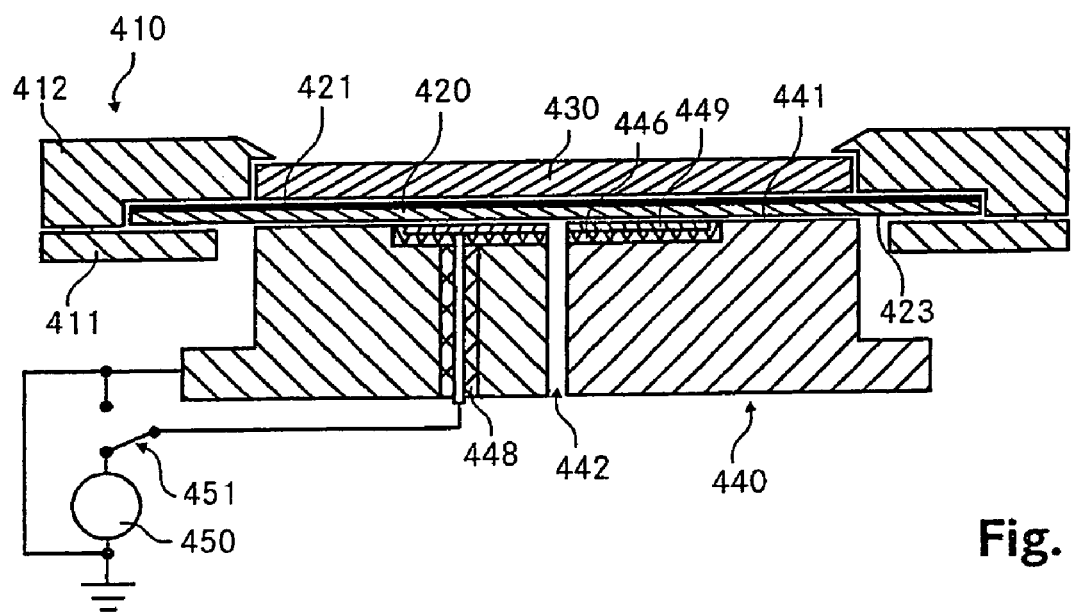
FIG. 4 diagrammatically depicts a bipolar electrode and a holding and transport frame of a fourth embodiment of a processing station according to the invention.

FIG. 4 diagrammatically depicts a bipolar electrode and a holding and transport frame of a fourth embodiment of a processing station according to the invention.

The mechanical structure and arrangement of the frame 410 are identical to the frame of the first and third embodiments, as illustrated in FIGS. 1 and 3. Once again, the carrier film 420 of polyimide with a thickness of 100 μm, to which the substrate 430 is secured over a large area, is clamped in the frame 410. The frame 410 is composed of an annular bottom part 411 and a corresponding annular top part 412 releasably connected to the bottom part, with the carrier film 420 clamped between the two parts of the frame.

The frame 410 with the clamped-in carrier film 420 is arranged adjacent to a planar upper outer surface 441 of a metallic electrode 440, with the lower main surface 423 of the carrier film 420 positioned parallel to and at a short distance from the upper outer surface 441 of the electrode 440. The surface area and shape of the upper outer surface 441 of the electrode 440 substantially corresponds to the shape and surface area of the substrate 430 which has been adhesively bonded to the carrier film 420.

A second electrode 449, the upper surface of which is flush with the upper outer surface 441 of the electrode 440, is recessed in a central region of the upper outer surface 441 of the electrode 440. The second electrode 449 is electrically insulated from the electrode 440 by a ceramic insulator plate 446. The diameter of the second electrode 449 is approximately half the diameter of the electrode 440.

Once again, in the region of its axis of symmetry the electrode 440 has a gas feed 442, which also passes through the insulator plate 446 and the second electrode 449 and through which a back-surface gas can be fed to the space between the carrier film 420 and the outer surface 441 of the electrode 440.

A voltage source 450, which generates a DC voltage between the two electrodes 440, 449, is connected between the metallic electrode 440 and the second electrode 449. The contact-connection of the second electrode 449 is in this case effected by means of an insulated leadthrough 448 which passes through the electrode 440 and the insulator plate 446. The electrode 440 is at ground potential, while the second electrode 449 is held at a potential of 700 V. This results in a scattered electric field, which generates electrostatic charges in the metallization along the upper main surface 421 of the film 420 and possibly also in the substrate 420. These electrostatic charges, the polarity of which is opposite to that of the respectively adjacent electrode, result in an attracting force, by which the film 420 with the substrate 430 adhesively bonded to it is pressed onto the electrode 440. The embodiment illustrated, therefore, realizes the principle of a bipolar electrostatic chuck within the context of the invention. There is no need for electrical contact-connection of the metallization which has been vapor-deposited on the film 420 or of the substrate 430.

The electrodes 440, 449 can be short-circuited with one another by a switch 451, so that both components are brought to ground potential. The carrier film 420 together with the substrate 430 can then be released from the electrode 440 without being impeded.

The arrangement of the individual electrodes at the upper outer surface of the electrode is not restricted to the annular shape illustrated. The two poles may also be distributed in other ways along the surface; by way of example, the inner electrode may be designed in a star shape. Furthermore, multipolar electrodes with more than two sub-electrodes can be designed in a similar way. An example of a possible arrangement is one in which the circular outer surface is divided in annular form as in the example illustrated and is additionally halved, so as to form four regions. Then, adjacent regions are connected to the current source in such a way that they in each case have a different polarity.

Figure 5:
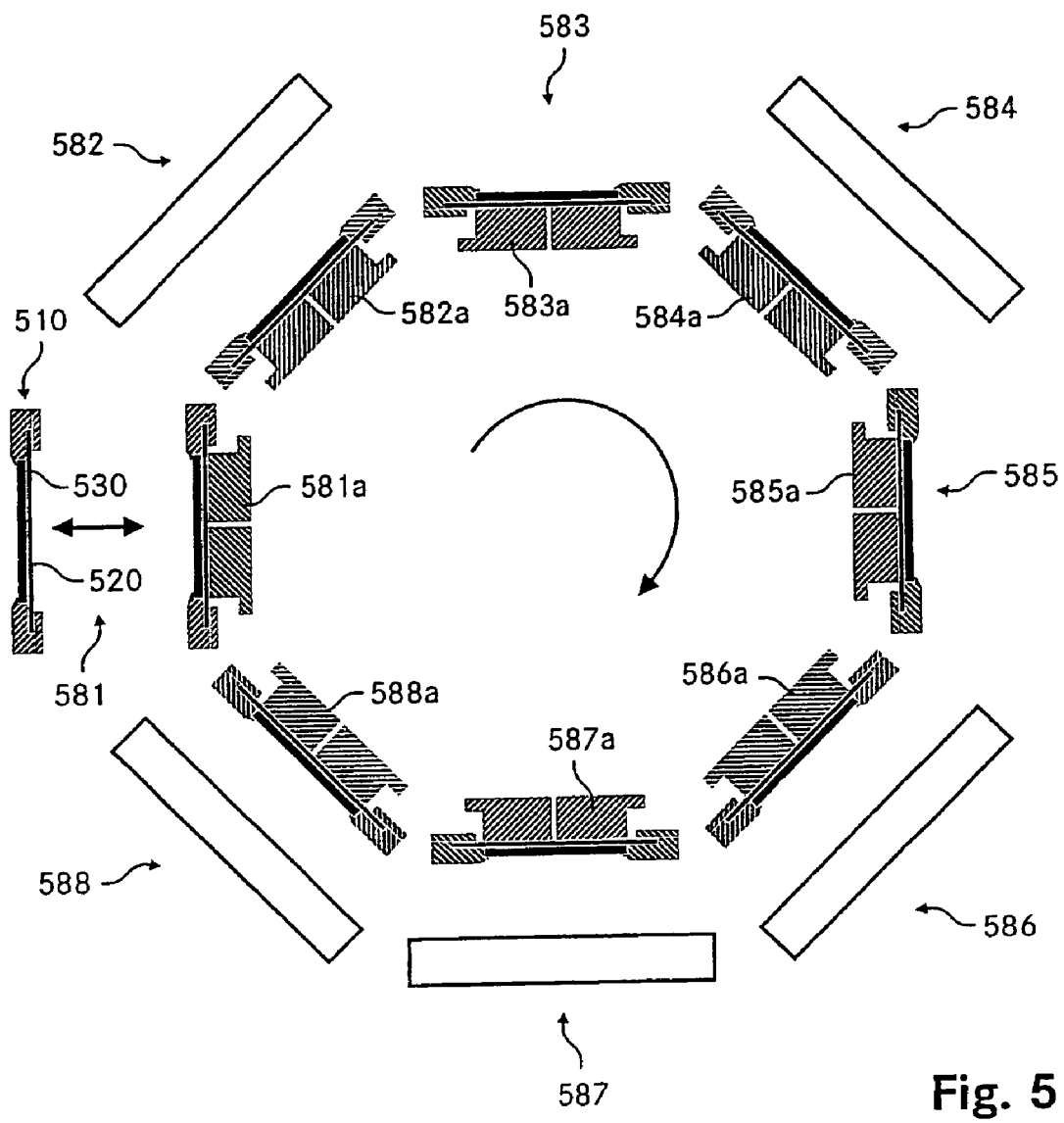
FIG. 5 diagrammatically depicts a vacuum process installation with a plurality of processing stations.

FIG. 5 diagrammatically depicts a vacuum process installation with a plurality of processing stations. The arrangement of the eight processing stations 581 . . . 588 forms a regular octagon. All the processing stations have an electrode 581*a* . . . 588*a* in accordance with one of the four embodiments described on the inner side; it is also possible for different electrodes (e.g. unipolar and bipolar electrodes or electrodes with a radiofrequency source) to be used in the same installation. The upper outer surfaces of the electrodes 581*a* . . . 588*a* are positioned vertically and are oriented outward.

A substrate 530, which has been adhesively bonded to a carrier film 520 clamped in a frame 510, is introduced into the installation at a transfer station 581 and removed from the installation again after processing, likewise at the transfer station 581. The transfer station 581 comprises, for example, a vacuum lock. The frame 510 remains vertically oriented throughout the whole of the processing. After the frame 510 together with the substrate 530 has been moved to the electrode 581*a*, a voltage is applied to the electrode (and if appropriate the frame) in accordance with one of the four embodiments which have been presented, so that the frame is held securely on the electrode 581*a*. The frame is then received in a star-shaped transport device (not shown), which can be used to simultaneously transport eight frames, each positioned in a processing station, in the clockwise direction into the next processing station.

The transport is followed by the first processing step in the degassing station 582, where the frame 510, as in all the processing stations 581 . . . 588, is held securely on the electrode 582*a* during the processing operation. This is followed by a cooling station 583. Since no plasma is required for electrical contact-connection of the substrate in the holding device according to the invention, it is easy to cool the substrate held on the electrode 583*a*. Next, there follows an etching station 584, which is in turn followed by a cooling station 585. Finally, there are three successive sputtering stations 586, 587, 588, after which the processed substrate 530 can be removed from the installation again at the transport station 581.

The dimensions indicated for the various pieces of equipment are to be understood merely as examples. They can be adapted to the particular electrical and mechanical requirements. This applies in particular to the extent and thickness of the electrode and its component parts, the frame and the film clamped therein. The materials may also be selected differently on the basis of the intended use. By way of example, it is possible for a film of a plastic other than polyimide, or as an alternative to a film a small plate of a ceramic, of glass or of another dielectric material, to be clamped into the frame as carrier for the substrate.

The voltage indicated for the direct current source can be adapted to the particular application and the dimensions of the electrode and the dielectric, so that it is possible to achieve a back-surface gas pressure which allows sufficient cooling of the substrate.

Significant influencing options result from adapting the material of the dielectric (the film in the first, third and fourth embodiments or the dielectric plate in the second embodiment). If a weakly doped dielectric material is used instead of a non-conductive dielectric material, the result is a "semiconducting dielectric". In this case, the charge shifts from the surface of the electrode into the dielectric, resulting in a shortened effective distance between the two mutually attracting "plates", which leads to a significantly higher contact pressure for the same voltage compared to an electrically insulating dielectric. What is known as a Johnsen Rahbek attraction results instead of a Coulomb attraction. A drawback of a doped dielectric of this type compared to a non-conductive dielectric may be that the semiconducting effect often only occurs at relatively high temperatures, which the installation according to the invention is in fact intended to avoid. Moreover, it is additionally necessary to provide a certain continuous charging current, so that the attraction is maintained.

The vacuum process installation illustrated is only an example. It is possible for a larger or smaller number of processing stations to be arranged in a ring or for the processing stations to be positioned linearly one behind the other. The apparatus according to the invention can also be used to load installations in which the substrates are transported on horizontally arranged carriers, e.g. in the known form of a cluster with a central handling station.

To summarize, it can be concluded that the invention provides an installation for processing a substrate which is of simple structure, easy to maintain and in which a thin and/or large-area, mechanically sensitive substrate can be processed without the risk of damage or destruction.

The invention claimed is:

1. An installation for processing a substrate having at least one processing station, wherein to hold and/or transport the substrate the installation comprises at least one frame having an annular top part and an annular bottom part with a carrier clamped in said frame between the top and bottom parts thereof, said carrier being adapted to have the substrate secured over substantially its entire surface to the carrier, said processing station comprising a chuck electrode having a surface, the carrier being made of a nonconductive dielectric material having a conductive layer disposed on one side thereof, said carrier being adapted to be removably positioned adjacent said surface of said chuck electrode so that said carrier and said chuck electrode together form an electrostatic chuck device wherein the conductive layer of said carrier and surface of said chuck electrode form two plates of a plate-type capacitor when positioned adjacently and connected to a voltage source.

2. The installation as claimed in claim 1, characterized
a) in that the frame is conductive at least regionally; and
b) in that the carrier is clamped in the frame in such a way that the conductive layer is contact-connected to the conductive region of the frame.

3. The installation as claimed in claim 1, characterized in that the carrier is formed by a vacuum-compatible, thermally stable film and the conductive layer is formed by a vapor-deposited metallization or a conductive polymer.

4. The installation as claimed in claim 3, characterized in that the film is from 50-200 μm thick, and the metallization is from 0.03-0.5 μm thick.

5. The installation of claim 3, said carrier being formed by a polyimide film.

6. The installation as claimed in claim 1, characterized in that the chuck electrode is constructed on a base body which comprises a radiofrequency electrode, the chuck electrode being electrically insulated from the radiofrequency electrode.

7. The installation of claim 6, wherein an insulated lead-through is provided passing through the radiofrequency electrode to provide a contact-connection with the chuck electrode.

8. The installation as claimed in claim 1, further comprising a dielectric layer arranged between the chuck electrode and the carrier when the carrier has been positioned adjacent to said surface of the chuck electrode.

9. The installation of claim 8, said dielectric layer comprising a plate of aluminum oxide ($Al_2O_3$).

10. The installation as claimed in claim 1, characterized in that the processing station comprises a voltage source for applying a voltage between the frame and the chuck electrode.

11. The installation of claim 10, said voltage source generating a DC voltage of 200-1500 V.

12. The installation of claim 10, said voltage source generating a DC voltage of 500-1000 V.

13. The installation as claimed in one of claim 1, characterized in that the chuck electrode comprises a plurality of regions of different polarity.

14. The installation as claimed in claim 1, characterized in that the processing station comprises a gas feed for feeding a gas into a space between the chuck electrode and the carrier.

15. The installation of claim 14, wherein said gas has a pressure of more than 100 Pa.

16. The installation of claim 1, said installation being a vacuum process installation.

17. The installation as claimed in claim 1, said substrate being secured to the carrier via an adhesive.

18. The installation as claimed in claim 1, said chuck electrode being fixed at said processing station, said frame being removable from said processing station to transport said carrier and substrate into and out of said processing station.

19. The installation as claimed in claim 1, said top and bottom parts of said frame being releasably connected together to clamp said carrier therebetween.

20. A frame structure for holding and/or transporting a substrate, comprising a frame having an annular top part and an annular bottom part and a film carrier clamped in said frame between the top and bottom parts thereof and being adapted to carry said substrate on a surface thereof said film carrier being made of a non-conductive dielectric material having a conductive layer disposed on one side thereof, said frame being conductive at least in a region thereof, said carrier being clamped in said frame so that said conductive layer of said carrier is in contact with said conductive region of the frame.

21. The frame structure of claim 20, said conductive layer of said film carrier being a vapor-deposited metallization or a conductive polymer that is vacuum-compatible and thermally stable, said non-conductive dielectric material of said film carrier being polyimide.

22. The frame structure as claimed in claim 20, said substrate being secured to the film carrier via an adhesive.

23. A method for processing a substrate in a vacuum process installation, wherein:

a) the substrate, in order to be held and/or transported, is secured over substantially its entire surface to a first planar main surface of a carrier clamped in a frame having an annular top part and an annular bottom part connected to ether to clam said carrier therebetween, b) the carrier is made of a nonconductive dielectric material having a conductive layer disposed at and forming the first main surface thereof, c) a chuck electrode is arranged with a planar outer surface thereof parallel to and adjacent a second planar main surface of the carrier, the second planar main surface being on the opposite side from the first planar main surface, and d) a voltage source is connected between the chuck electrode and the conductive layer of the carrier, such that the carrier and the chuck electrode together form an electrostatic chuck device, said conductive layer of the carrier and the chuck electrode outer surface forming two plates of a plate-type capacitor.

24. The method as claimed in claim 23, characterized in that the substrate is adhesively bonded to the first planar main surface of the carrier by means of a vacuum-compatible and releasable adhesive.

25. The method as claimed in claim 23, characterized in that the chuck electrode is built on a base body which is formed by a radiofrequency electrode, the chuck electrode being electrically insulated from the radiofrequency electrode, and the voltage being applied between the chuck electrode and the frame.

26. The method as claimed in claim 23, characterized in that a voltage is applied between the frame and the chuck electrode.

27. The method as claimed in claim 23, characterized in that to control the temperature of the substrate a gas at a superatmospheric pressure is introduced into a space between the second main surface of the carrier and the planar outer surface of the chuck electrode.

28. The method as claimed in claim 23, characterized in that to release the substrate and the carrier, the conductive layer of the carrier is short-circuited with the chuck electrode.

29. The method as in claim 23, further comprising applying a voltage between the chuck electrode and said conductive layer to electrostatically attract the carrier and the chuck electrode to one another during a processing step for the substrate, and thereafter removing said voltage and removing said frame and the carrier clamped therein from adjacent the chuck electrode.

30. A method for processing a substrate in a vacuum process installation, wherein:
  a) the substrate, in order to be held and/or transported, is secured over substantially its entire surface to a first planar main surface of a carrier clamped in a frame having an annular top part and an annular bottom part connected together to clamp said carrier therebetween,
  b) the carrier is made of a nonconductive dielectric material having a conductive layer disposed at and forming a second main surface of the carrier opposite said first main surface,
  c) a chuck electrode is arranged with a planar outer surface thereof parallel to and adjacent the second planar main surface of the carrier, wherein a dielectric layer is arranged between the chuck electrode and the second planar main surface of the carrier, and
  d) a voltage source is connected between the chuck electrode and the conductive layer of the carrier,
  such that the carrier, the chuck electrode and the dielectric layer between them together form an electrostatic chuck device, said conductive layer of the carrier and the chuck electrode outer surface forming two plates of a plate-type capacitor.

31. The method as claimed in claim 30, said substrate being secured to the carrier via an adhesive.

32. The method as in claim 30, further comprising applying a voltage between the chuck electrode and said conductive layer to electrostatically attract the carrier and the chuck electrode to one another during a processing step for the substrate, and thereafter removing said voltage and removing said frame and the carrier clamped therein from adjacent the chuck electrode.

* * * * *